United States Patent [19]
Lal et al.

[11] Patent Number: 5,356,522
[45] Date of Patent: Oct. 18, 1994

[54] METHOD FOR MANUFACTURING THIN-FILM MEDIUM WITH CHROMIUM UNDERLAYER GRADIENT

[75] Inventors: Brij B. Lal, San Jose; Tadashi Shinohara, Fremont, both of Calif.

[73] Assignee: HMT Technology Corporation, Fremont, Calif.

[21] Appl. No.: 995,879

[22] Filed: Dec. 23, 1992

Related U.S. Application Data

[63] Continuation-in-part of Ser. No. 837,855, Feb. 18, 1992, Pat. No. 5,324,593, and Ser. No. 964,745, Oct. 22, 1992.

[51] Int. Cl.$^5$ .............................. C23C 14/34
[52] U.S. Cl. ........................... 204/192.15; 204/192.2; 204/192.23
[58] Field of Search ........... 204/192.15, 192.2, 298.25, 204/298.26, 192.16, 192.23

[56] References Cited

U.S. PATENT DOCUMENTS

| | | | |
|---|---|---|---|
| 4,322,276 | 3/1982 | Meckel et al. | 204/298.26 X |
| 4,558,388 | 12/1985 | Graves, Jr. | 204/298.25 X |
| 4,626,336 | 12/1986 | Bloomquist et al. | 204/298.25 X |
| 4,786,564 | 11/1988 | Chen et al. | 204/192.2 X |
| 4,894,133 | 1/1990 | Hedgcoth | 204/298.26 X |
| 5,004,652 | 4/1991 | Lal et al. | 204/192.2 X |
| 5,084,152 | 1/1992 | Lin | 204/192.2 X |
| 5,134,038 | 7/1992 | Baseman et al. | 428/611 |

*Primary Examiner*—Nam Nguyen
*Attorney, Agent, or Firm*—Peter J. Dehlinger

[57] ABSTRACT

A magnetic thin-film medium is disclosed. The medium includes a disc-like non-metallic substrate, and a sputtered underlayer having an axial composition gradient in which a lowermost stratum of the layer is a coating metal, such as Ti, V, or W, and an uppermost stratum of the underlayer is Cr. A magnetic thin-film layer is formed on the substrate, and a overcoat is formed on the magnetic layer. Also disclosed is a method of forming the medium.

6 Claims, 3 Drawing Sheets

METHOD FOR MANUFACTURING THIN-FILM MEDIUM WITH CHROMIUM UNDERLAYER GRADIENT

The present application is a continuation-in-part of co-owned U.S. patent application Ser. No. 837,855, for "Thin-Film Medium with Layered Film Gradient," filed Feb. 18, 1992, now U.S. Pat. No. 5,324,593 and co-owned U.S. patent application Ser. No. 964,745, for "Thin-Film Recording Medium with Thin Chromium Underlayer, filed Oct. 22, 1992.

FIELD OF THE INVENTION

The present invention relates to a thin-film magnetic medium having a metal coating/chromium underlayer gradient, and to a method of preparing such a medium.

REFERENCES

Futamoto, M., et al., IEEE Transactions on Magnetics, 27 (6):5280 (1991).
Miller, M.S., et al., J. Applied Phys, 69 (8):4715 (1991).
Ranjan, R., et al., J. Applied Phys, 69 (8):4727 (1991).
Sanders, I., et al., IEEE Transactions on Magnetics, 25 (5): 3869 (1989).
Shiroishi, Y., et al., IEEE Transactions on Magnetics, 24 (6):273 (1988).
White, R. (ed.), Introduction to Magnetic Recording, IEEE Press, N.Y. (1985).
Yogi, T., et al., IEEE Transactions on Magnetics, 26 (5):2271 (1990).
Yogi, T., et al., J. Applied. Phys, 69 (8):4749 (1991).

BACKGROUND OF THE INVENTION

Thin-film hard disk magnetic media are widely used in read/write memory devices in computers. Increasingly, there is an effort in the thin-film medium industry to achieve higher recording density (Futamoto et al.). Among the magnetic properties which are important to a high recording density are:

(1) Coercivity, defined as the magnetic field required to reduce the remanence magnetic flux to 0, i.e., the field required to erase a stored bit of information. Higher coercivity in a medium allows adjacent recorded bits to be placed more closely together without mutual cancellation. Thus, higher coercivity is associated with higher information storage density.

(2) Bit shift or peak shift, a phenomenon which refers to the broadening between voltage peaks, as well as reduction in peak amplitude, which occurs in the read voltage waveform, where the peak-to-peak broadening time is typically less than about 25 nsec. It is desired to achieve low bit shifting, inasmuch as bit shifting limits the resolution at which adjacent peaks can be read, and thus places an upper limit on recording density.

(3) Signal-to-noise is the relative strength of background noise to the data signal obtained during reading of the thin-film medium. The higher the ratio of signal to noise, the cleaner the sensed information signal and the less likelihood there is of having erroneous readings.

(4) Bit density is the density in the medium that bits are recorded. A bit is identified as a flux transition in the medium, and bit density is measured the number of flux transitions per unit length. Typically, the higher the bit density, the lower the signal-to-noise ratio.

(5) Pulse width is a parameter that is generally inversely related to the coercivity. That is, the higher the coercivity, the narrower a bit needs to be sensed.

(6) Signal amplitude, or peak-to-peak amplitude of a single pulse, as a function of recording frequency. The recording density of the medium is related to the drop in signal amplitude at increasing recording frequency.

(7) Signal resolution, defined as the ratio of the high-frequency track average amplitude divided by the low-frequency track amplitude. The recording frequency at which 70% resolution is achieved represents one measure of information storage density on the disk.

Thin-film media or disks are commonly prepared by sputtering a thin magnetic film on a substrate, such as a textured, plated aluminum substrate. The disk is typically prepared by sputtering an underlayer, such as a chromium underlayer, onto the substrate surface, then sputtering a cobalt-based magnetic thin film over the underlayer. A protective, lubricating carbon overcoat may be applied over the thin-film layer by sputtering.

A variety of magnetic film alloys have been reported in thin-film media of the type just described (e.g., Yogi, Miller, Sanders, Shiroishi). U.S. Pat. No. 4,888,514 discloses a thin film disk having a cobalt-nickel layer sputtered over a chromium underlayer. A coercivity of 650 Oe (Oersteds), a saturation magnetization of greater than 10,000 Gauss, and a loop squareness ratio of greater than 0.9 were reported. Magnetic thin-film media with chromium underlayer with cobalt-nickel or cobalt-nickel-chromium alloy magnetic layers are also disclosed in U.S. Pat. Nos. 4,833,044, 4,816,127, and 4,735,840.

U.S. Pat. No. 4,786,564 issued to Chen et al. also discloses the use of nickel-phosphorus (Ni/P) sublayers on an aluminum substrate. This process was developed to control the nucleation and growth of the crystalline structure of the magnetic media and also to prevent nonuniformities in the substrate surface from affecting the magnetic characteristics of the media.

Longitudinal magnetic recording media for hard disk drives have typically employed a textured Ni/P-coated Al substrate. The advent of lower fly heights and higher recording densities have placed severe requirements on the substrate. Ni/P-coated Al substrates of thicknesses below 35 mils have shown significant problems in maintaining good fly characteristics below 4 microinches. As the thickness of the substrate is reduced, these substrates have also shown a greater susceptibility to handling damage and mechanical flatness.

Nonmetallic substrates, such as canasite ™ (glass-ceramic), glass or carbon substrates, have smoother surfaces and higher flexural strength. As a result, they are capable of providing superior fly properties and are potential replacements for Ni/P-coated Al substrates.

A canasite ™ substrate conventionally is placed in a high vacuum deposition system and preheated to 200°-300° C. DC magnetron sputtering is then used to sequentially deposit a Cr underlayer followed by the magnetic alloy and a thin protective carbon overcoat.

Longitudinal magnetic recording media deposited on canasite ™ substrates have exhibited lower coercivities and squarenesses than similar media deposited on standard aluminum substrates. Media on canasite ™ substrates exhibit lower outputs, higher noise and increased bit-shifts over comparable media deposited on Ni/P-coated Al substrates. They exhibit lower coercivities and squareness, and higher oxygen levels. More specifically, the coercivity is usually lower by 175–460

Oe, HF signal amplitude is typically 25% lower, and bit shift is greater by 4.5 ns.

Increased coercivity in a medium formed on a glass substrate has been reported. In the approach reported in this reference, a glass substrate is coated with a sputtered NiP coating to a thickness of about 2,000 Å. After texturing the coated substrate, the substrate is successively sputtered with chromium, to a thickness of about 500 Å layer, and then with a Co-based magnetic alloy, to a thickness of about 600 Å. The medium showed an enhanced coercivity which was nonetheless significantly lower than that achieved in a comparable medium formed on a conventional Ni/P-coated Al substrate.

Co-owned U.S. patent application for "Thin-Film Recording Medium," Ser. No. 790,585, pending, filed Nov. 8, 1991, discloses a thin-film magnetic recording medium composed of a glass or ceramic substrate. Formed on the substrate is a sputtered Ni/P sublayer having a thickness between about 80–1,000 Å, preferably 100–500 Å, a sputtered chromium underlayer having a thickness between 1,000–3,000 Å, preferably at least about 2,000 Å, and a sputtered magnetic layer having a thickness between about 200–800 Å. The medium has a substantially higher coercivity, HF signal amplitude, and signal-to-noise ratio than the same medium formed in the absence of the sputtered nickel-phosphorus sublayer.

Co-owned U.S. patent application for "Thin-Film Recording Medium with Thin Chromium Underlayer," Ser. No. 964,745, pending, filed Oct. 22, 1992 discloses a magnetic thin-film medium in which the chromium underlayer has a thickness between about 100–300 Å, and a sputtered magnetic thin-film layer formed from a Co alloy. The medium is characterized by high coercivity and signal-to-noise ratio.

SUMMARY OF THE INVENTION

In one aspect, the invention includes a magnetic thin-film medium which includes (i) a disc-like non-metallic substrate, (ii) a sputtered underlayer having an axial compositional gradient, (iii) a sputtered magnetic thin-film layer having a thickness between about 200–1,000 Å, and (iv) a carbon or oxide overcoat. The compositional gradient is formed of a lowermost stratum, immediately adjacent the substrate, composed of Ti, V, W, Si, Mo, Hb, Nb, Ag, B, Al, Gd, or Ni/P, or combinations thereof, an uppermost stratum is composed of Cr, and an intermediate mixed-component stratum.

In one general embodiment, the underlayer has a thickness between about 100–300 Å. In another embodiment, the underlayer has a thickness of between about 1,000–4000 Å. Both types of media are characterized by high coercivity, good loop squareness and high signal-to-noise ratio. Preferred coating metals are Ti, W, or V.

The sputtered magnetic thin film in the medium may also have an axial composition gradient in which a lower-most stratum of the layer, immediately adjacent the sputtered underlayer, is composed of a first alloy having relatively low noise and low magnetic remanence characteristics, when deposited by sputtering as a single magnetic layer, and an uppermost stratum of the underlayer is composed of a second alloy having relatively high noise and magnetic remanence characteristics. The medium is characterized by (i) a coercivity which is substantially greater than that of a similar medium whose magnetic thin-film layer is composed of either the first or second alloy alone; and (ii) a media noise level which is substantially less than that of a similar medium whose magnetic thin-film layer is composed of either the first or second alloy alone.

Also forming part of the invention is a method of forming a magnetic thin-film medium of the type just described. The method includes moving a disc-like non-metallic substrate such as glass, carbon, or ceramic substrate, in an upstream-to-downstream direction, through a first sputtering zone having a segmented target which provides (i) an upstream target segment composed of Ti, W, V, Si, Mo, Nb, Ag, B, Al, Gd, or Ni/P, or combinations thereof, and (ii) a downstream target segment composed of Cr. The upstream target segment is positioned to deposit sputtered material onto the substrate, as the substrate moves into and through an upstream region of said sputter deposition zone, and the downstream target segment is positioned to deposit sputtered Cr onto the substrate, as the substrate moves through and out of a downstream region of said sputter deposition zone. After underlayer formation, the substrate is moved through a second sputtering zone having a Co-based magnetic alloy target, to deposit on the underlayer, a magnetic thin film having a thickness between about 200–1,000 Å, and finally moved through a third sputtering zone having a graphite target, to deposit a carbon overlayer on the magnetic thin film.

These and other objects and features of the present invention will become more fully apparent when the following detailed description of the invention is read in conjunction with the accompanying drawings.

DETAILED DESCRIPTION OF THE INVENTION

I. Thin-Film Medium

Figure 1:
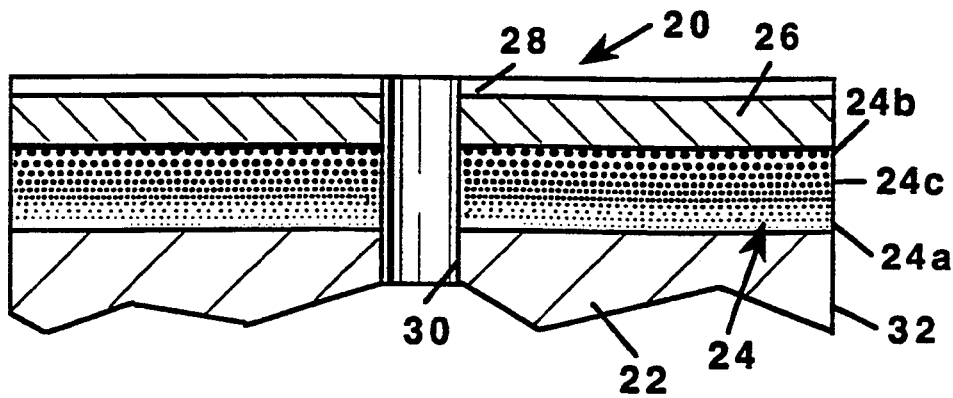
FIG. 1 is a cross-sectional view of a thin-film magnetic disc formed in accordance with one embodiment of the invention.

FIG. 1 shows in cross sectional view, a fragmentary portion of a thin-film medium or disc 20 formed in accordance with one embodiment of the present invention. The disc generally includes a rigid non-metallic substrate 22, and forming successive thin-film layers over the substrate, a sputtered underlayer 24, a magnetic thin-film layer 26, and a protective overcoat 28.

The non-metallic substrate may be either a glass, carbon, silicon, glass-ceramic, or ceramic substrate. An example of a glass-ceramic substrate is a canasite TM substrate. Such substrates are formed initially as an amorphous glass, then heated under conditions which produce a crystalline, ceramic phase. A ceramic substrate may be formed conventionally by scintering alumina particles, then coating the ceramic with a glass surface coating. Such substrates, which are commercially available, have a thickness of about 1.27 mm for a 95 mm disc, and conventional testing is done at ID/OD values of about 0.8 inch and 1.78 inch, respectively.

One method for texturing a glass substrate is described in parent U.S. patent application for Ser. No. 475,715, "Glass Substrate with Controlled Low-Friction Surface," filed Feb. 6, 1990, now U.S. Pat. No. 5,119,258 which is incorporated by reference herein. Alternatively, the glass or ceramic substrate may be micro-roughened by known mechanical texturing methods. In still another embodiment, a disk substrate having a desired surface texturing may be obtained from commercial sources. One such commercial substrate is a canasite TM ceramic substrate available from Corning Glass (Corning, N.Y.). The substrate is available in conventional and well as non-standard thicknesses, and has a micro-roughened surface having a density of zero crossings of about 70/mm, and a peak-to-valley depth of between about 10–30 nm.

Two conventional size substrates have outer diameters of 130 and 95 mm (5.1 and 3.74 inches), with corresponding inner diameters of 40 and 25 mm (1.57 and 0.98 inches), respectively. The discs used for the preferred embodiment of the present invention the comparative embodiments have inner diameters of 0.790 and 0.4724 inches and outer diameters of 2.560 and 1.890 inches. The inner and outer edges of the disc which define these diameters are indicated at 30, 32, respectively, in FIG. 1.

According to an important feature of the invention, underlayer 24 in the medium has an axial compositional gradient, i.e., a gradient in the direction of the rotational axis of the medium substrate. The gradient includes a lowermost stratum 24a, immediately adjacent (in contact with) substrate 22, an uppermost stratum 24b immediately adjacent (in contact with) thin-film layer 26, and an intermediate stratum 24c between the lowermost and uppermost strata. As will be described below, the compositional gradient is formed under conditions in which the lowermost stratum is composed of a coating metal, designated $M_1$, such as Ti, V, W, Si, Mo, Nb, Ag, B, Al, Gd, or Ni/P, or combinations thereof. The uppermost stratum of the underlayer is composed of Cr, indicated by $M_2$, and the intermediate stratum is a compositional gradient between the two limiting compositions.

One preferred coating metal $M_1$ is Ti (titanium). Other preferred coating metals M, are W (tungsten), V (vanadium) and Al (aluminum).

In one general embodiment, the gradient-composition underlayer has a thickness between 100–300 Å. A thin-film medium formed with a 100–300 Å sputtered underlayer has been described in co-owned U.S. patent application Ser. No. 07/964,745, pending, for "Thin-Film Recording Medium With Thin Chromium Underlayer," filed Oct. 22, 1992, which is incorporated by reference herein. The medium is characterized by high coercivity, e.g., greater than 1,200 Oe, good loop squareness ratio, e.g., greater than 0.8, and high signal-to-noise (SNR) ratio.

In another embodiment, the gradient-composition underlayer has a thickness between 500–4,000 Å, and preferably 1,000–4,000 Å. High coercivity, remanence and loop squareness values are achieved particularly at an underlayer thickness of about 2,000 Å or greater.

The magnetic thin-layer film is formed by sputtering onto the underlayer, a magnetic film alloy suitable for thin film media, such as a Co/Cr or Co/Ni binary alloy, a Co/Cr/Ta, Co/Cr/Pt, Co/Ni/Ta or Co/Ni/Cr ternary alloy, or a Co/Cr/Ta/Pt or Co/Ni/Ta/Pt quaternary alloy. One preferred magnetic thin film alloy is composed of 67 atom percent Co, 25 atom percent Ni, and 8.0 atom percent Cr. The sputtered magnetic-film layer has a preferred thickness between about 200–1,000 Å, more preferably between about 200–450 Å.

The carbon overcoat in the thin-film medium is preferably a carbon layer formed by sputtering carbon onto the magnetic layer, under conditions in which the carbon is in a predominantly diamond-like structure. The overcoat thickness is preferably between about 250 and 400 Å.

Figure 2:
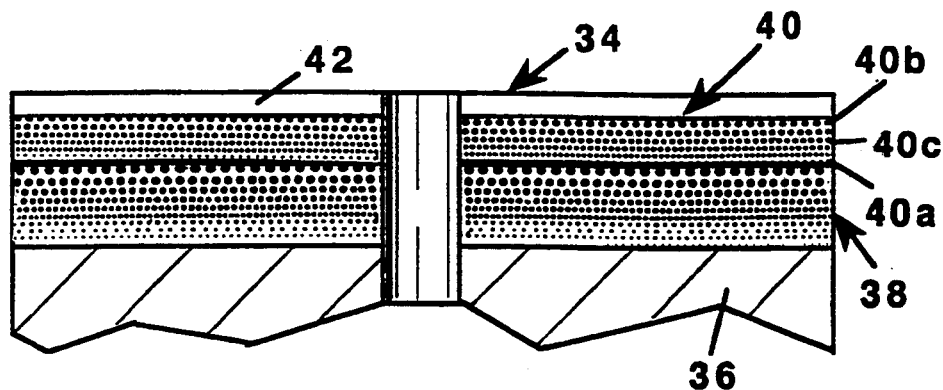
FIG. 2 is a cross-sectional view of a thin-film magnetic disc formed in accordance with a second embodiment of the invention.

FIG. 2 shows in cross section view, a fragmentary portion of a thin-film medium or disk 34 formed in accordance with another embodiment of the present invention. The disk includes a non-metallic substrate 36, like substrate 22, a gradient composition underlayer 38, like underlayer 24, a gradient composition thin-film layer 40, and protective overcoat 42, like above overcoat 28.

The sputtered magnetic thin-film layer 40 has an axial composition gradient composed of a lowermost stratum 40a immediately adjacent (in contact with) underlayer 38, an uppermost stratum 40b immediately adjacent (in contact with) overcoat 42, and an intermediate stratum 40c between the lowermost and uppermost strata.

The lowermost stratum of the thin-film layer is composed of a first alloy, identified generally as $M_1$, having relatively low noise and low magnetic remanence characteristics, when deposited by sputtering as a single magnetic layer. The uppermost stratum is composed of a second alloy having relatively a high magnetic remanence characteristic. Intermediate stratum 40c is a transitional gradient from alloy $M_1$ to alloy $M_2$. The medium is characterized by (i) a coercivity which is substantially greater than that of a similar medium whose magnetic thin-film layer is composed of either the first or second alloy alone; and (ii) a media noise level which is substantially less than that of a similar medium whose magnetic thin-film layer is composed of either the first or second alloy alone.

The magnetic layer in the FIG. 2 embodiment has a preferred magnetic-film thickness between about 200 to 400 Å. In the embodiment shown, the lowermost and uppermost strata are composed of different magnetic alloys, preferably Co-based magnetic alloys. Typically, the alloys will contain Co and one or more of the elements Cr, Ta, V, W, B, Zr, Si, Hf, P. In one embodiment, the lower alloy ($M_1$) is composed of 70–85 atom percent cobalt, 5–20 atom percent chromium, and 2–10 atom percent tantalum. A specific example is an alloy containing Co/Cr/Ta at an atom ratio of 88:8:4. The upper alloy is composed of 55–70 atom percent cobalt, 20–40 atom percent nickel, and 3–10 atom percent chrome. One specific example contains 67 atom percent cobalt, 35 atom percent nickel, and 8 atom percent chrome.

Figure 3:
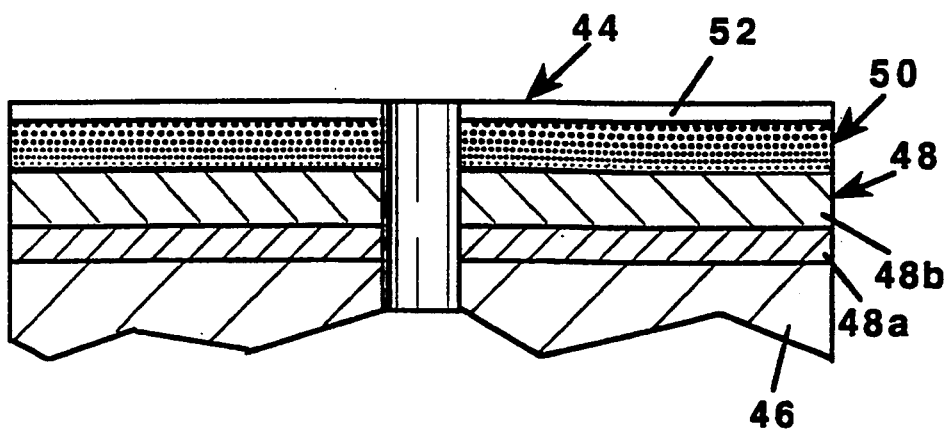
FIG. 3 is a cross-sectional view of a thin-film magnetic disc formed in accordance with a third embodiment of the invention.

FIG. 3 shows in cross section view, a fragmentary portion of a thin-film medium or disk 44 formed in accordance with a third embodiment of the present invention. The disk includes a non-metallic substrate 46, like substrate 22, a two-sublayer underlayer 48, a gradient composition thin-film layer 50, like gradient composition layer 40, and a protective overcoat 52, like above overcoat 28.

The two sublayers forming the sputtered underlayer include a lower metal coating sublayer 48a formed of the above-mentioned coating metal $M_1$, such as sputtered Ti sublayer, and having a thickness of at least 75 Å, and a preferred thickness range between about 80–1,000 Å, and preferably 100–500 Å. An upper sublayer 48b in the underlayer is a crystalline underlayer formed by sputtering from a chromium target to a sublayer thickness between about 1,000–3,000 Å. High coercivity, remanence and loop squareness values are achieved particularly at an underlayer thickness of about 2,000 Å or greater. Chromium-containing alloys, such as CrV, CrGd, and CrSi, may also be suitable.

II. Method of Producing the Medium

A conventional sputtering apparatus (not shown) may be used in the method of the invention for producing the thin-film medium described in Section I. The apparatus includes a vacuum chamber having at least four stations at which sputtering or heating operations occur. A heating station at the upstream end of the chamber has a plurality of infrared lights which are arrayed for heating both sides of a substrate carried through the station in the chamber on a disc holder or pallet.

Downstream of the heating station are three sputtering stations at which are sputtered (1) the gradient-composition underlayer, (2) the magnetic thin film, which may be a gradient-composition film, and (3) the carbon overlayer. Where the medium has the construction shown in FIG. 3, the apparatus will include four chambers, the first two being used for forming the two-sublayer underlayer. The basic sputtering apparatus is preferably a commercial system, such as in available from Varian/Intevac (Santa Clara, Calif.), Circuits Processing Apparatus (Fremont, Calif.), ULVAC (Japan), Leybold Heraeus (Germany), VACTEC (Boulder, Colo.), or Materials Research Corporation (Albany, N.Y.) Anelva, Japan. These systems are double-sided, in-line, high-throughput machines having two interlocking systems, for loading and unloading.

In operation, the sputtering chamber is evacuated to pressure of about $10^{-7}$ Torr, and argon gas is introduced into the chamber to a final sputtering pressure of 5–20 mTorr. The substrate is heated in the heating station to a selected temperature before advancing into the three sputtering chambers. The heating conditions in the apparatus are preferably adjusted to achieve a substrate temperature of between about 200° C., and preferably about 270° C.

Figure 4:
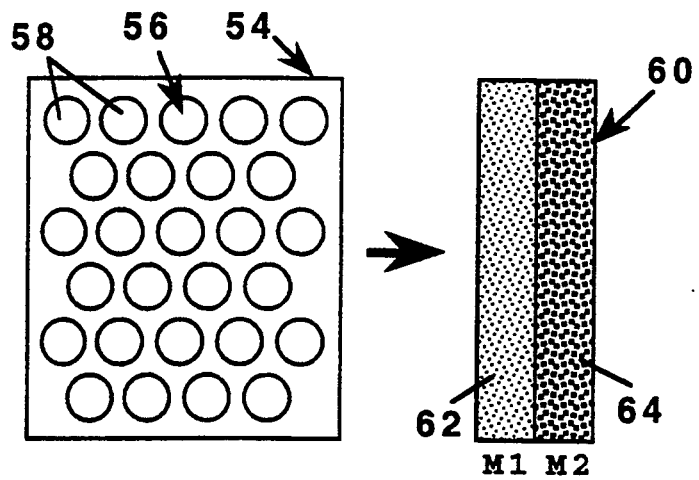
FIG. 4 is a simplified plan view showing a pallet of discs prior to passage through a sputtering station in a sputtering apparatus used in producing the thin-film medium of the invention.

FIG. 4 shows a pallet 54 containing an array 56 of individual non-metallic discs, such as discs 58. The pallet is carried successively through the three sputtering chambers, in an upstream-to-downstream direction (indicated by the arrow in FIG. 4). The figure also shows a segmented target 60 in the first sputtering chamber, i.e., the chamber at which the gradient-composition underlayer is to be formed. The target is formed of an upstream portion 62 composed of alloy $M_1$ and an abutting downstream portion 64 composed of alloy $M_2$. The target has a length corresponding to the length of the pallet so that all discs are consistently sputtered with the target alloys as the pallet passes through the sputtering station.

As seen in side view (FIG. 5), the upstream and downstream portions of target 60 are formed as a unitary single target. The two portions are joined along an angled face 66 in order to facilitate adhesion during manufacture. Other forms of targets are also within the contemplation of the invention. For example, the two portions could be slightly spaced apart if a reduced intermediate stratum is desired relative to lower and upper stratums. Also as seen in the figure, the average lengths, $L_1$ and $L_2$, of the two portions are approximately equal.

Figures 5, 6:
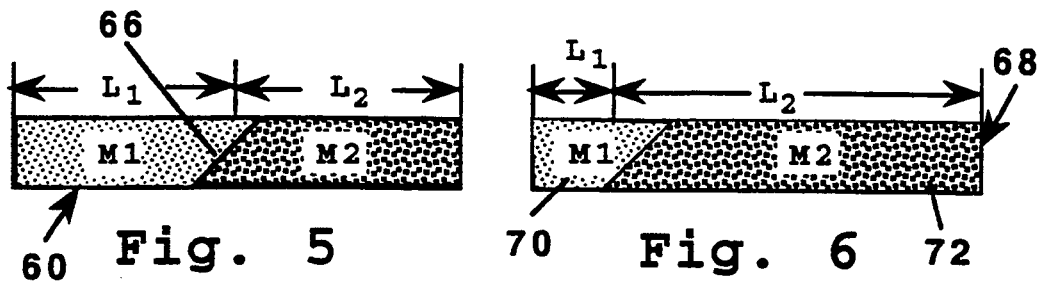
FIG. 5 is an end view of the sputtering target of FIG. 4.
FIG. 6 is an end view of a sputtering target formed in accordance with another embodiment of the invention.

The relative dimensions of the upstream and downstream portions of the target can be varied to selectively vary the amount of deposition from each portion. FIG. 6, for example, illustrates a segmented target 68 formed of a relatively short ($L_1$) upstream portion 70, and a relatively long ($L_2$) downstream portion 72. The two segments have the $M_1$ and $M_2$ compositions described above. The composition gradients produced by the two targets illustrated in FIGS. 5 and 6 will be discussed below with respect to FIGS. 8 and 9, respectively.

Figure 7A:
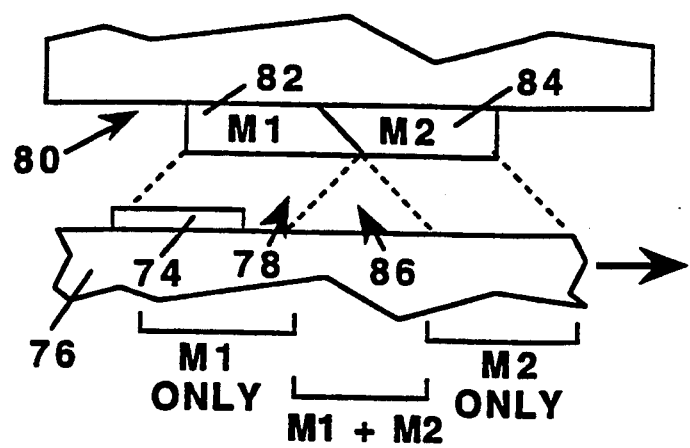
FIGS. 7A–7C are simplified end views of the sputtering station of FIG. 4, illustrating sputtering deposition of an underlayer in accordance with the method of the invention.
Figure 7B:
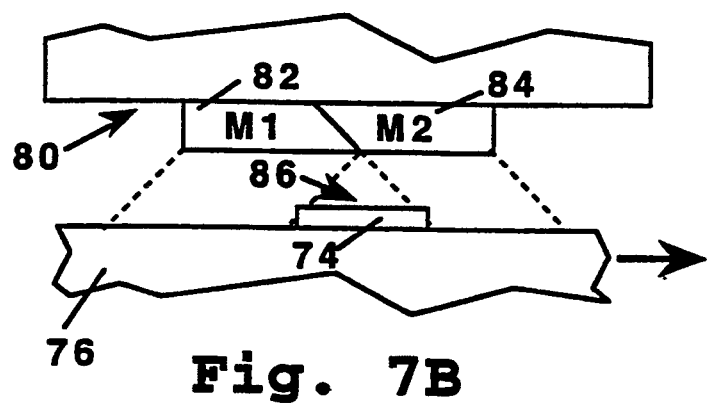
Figure 7C:
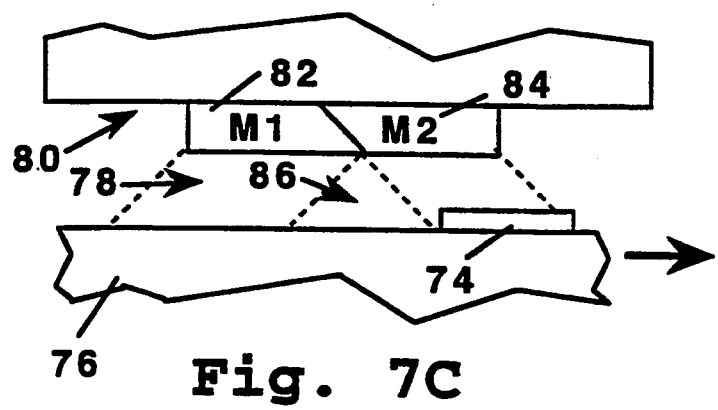

FIGS. 7A–7C illustrate the process of forming an underlayer with a compositional gradient, in accordance with the invention, as part of the production of a thin-film medium. FIG. 7A illustrates a substrate 74 carried on a pallet 76 as the substrate is entering the upstream region 78 of a sputtering zone 80 in which the underlayer will be formed. As can be appreciated from the figure, the disc surface will initially see only sputtered material $M_1$ from the upstream segment of the target, here indicated at 82. This initial deposition of $M_1$ material only produces the lower stratum of the underlayer.

As the target moves into and through the sputtering zone, it receives progressively more sputtered material from the downstream segment of the target, indicated at 84. When the disc reaches the position shown in FIG. 7B, midway through the zone in a central region 86 of the zone, the disc will receive material from the two target segments in the same ratio as the target deposition rates from the two segments, e.g., equal amounts $M_1$ and $M_2$.

Finally, as the target moves through the downstream region 88 and out of the sputtering zone, it will receive sputtered material from downstream segment 84 only, ultimately producing the uppermost stratum composed of $M_2$ only (the chromium stratum).

This sputtering process just described results in an underlayer formed with an axial composition gradient having lower, intermediate and upper strata as is described above with reference to FIG. 1.

Figure 8:
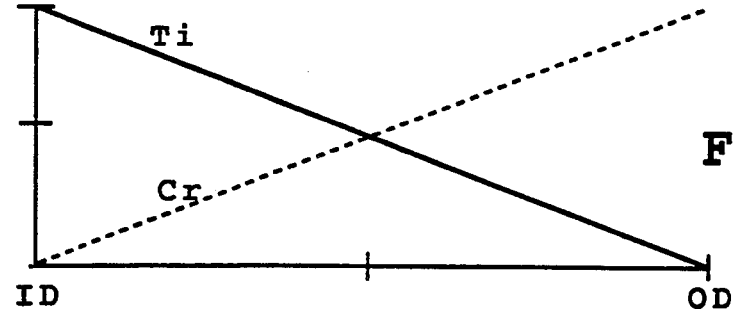
FIG. 8 is a plot of the Ti and Cr composition gradients in an underlayer formed with the target illustrated in FIG. 5.

FIG. 8 shows the axial composition gradient of an underlayer formed by a target of the type described with reference to FIG. 5, where $M_1$ is Ti (solid line) and $M_2$ is chromium (dashed line). The ordinate in the figure represents percent of each composition $M_1$ and $M_2$ on progressing from the disc's inner diameter to its outer diameter.

Figure 9:
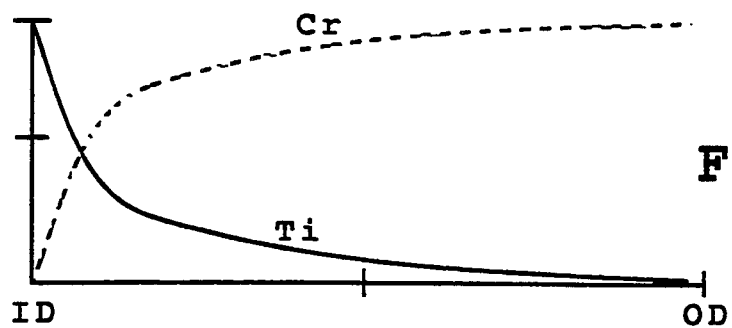
FIG. 9 is a plot of the Ti and Cr composition gradients in an underlayer formed with the target illustrated in FIG. 6.

FIG. 9 shows the axial composition gradient of an underlayer formed by a target of the type described with reference to FIG. 6, where $M_1$ and $M_2$ are the same as in FIG. 5. The composition illustrates how selected gradients of the two compositions can be formed according to the design of the two-segment target. The FIG. 9 gradient provides a relatively thin lower sublayer in which Ti is the dominant component, and a relatively thick upper sublayer in which Cr is the dominant component.

The same features described above with respect to the formation of a gradient-composition underlayer also apply to the formation of a gradient-composition magnetic layer, such as in the medium illustrated in FIGS. 2 and 3. Here the target segments, such as target segments 62, 64 in target 60 in FIG. 5, are formed of two magnetic alloy material $M_1$ and $M_2$, as discussed above.

More specifically, the upstream segment is preferably composed of a first alloy having relatively low noise and low magnetic remanence characteristics, when deposited by sputtering as a single magnetic layer. The downstream target segment is composed of a second alloy having a relatively high magnetic remanence characteristic. The magnetic layer formed by sputtering from this target, as a disc travels through a sputtering zone in an upstream-to-downstream direction, results in a composite magnetic film having (i) a coercivity which is substantially greater than that of a similar medium whose magnetic thin-film layer is composed either the first or second alloy alone, and (ii) a media noise level which is substantially less than that of a similar medium whose magnetic thin-film layer is composed either the first or second alloy alone.

From the foregoing, it can be appreciated how various objects and features of the invention are met. A two-segment composite target is used in an in-line sputtering system to produce a compositional gradient thin-film media, having an axial composition gradient. One advantage provided by this approach is that two sublayers, such as Ti and Cr sublayers can be formed efficiently within a single sputtering zone, increasing the speed and efficiency of producing sputtered thin-film media.

In addition, the compositions of the two sublayers form continuous gradients between inner and outer diameters, avoiding interface discontinuities, and obtaining advantages of mixed compositions, such as Cr/Ti, Cr/W, or Cr/V compositions in the underlayer.

Where the approach is also applied to a magnetic thin-film layer, several advantages in magnetic properties of the medium can be achieved. The remanence magnetization of the compositional gradient media is higher than the single-alloy media, at least with respect to the CoCrTa medium. The coercivity is higher and the coercivity increases more for an increase in Cr-underlayer thickness and substrate heating. The bit shift and media noise are reduced. The SNR is better than the high-noise single medium and equivalent to the low-noise single medium. It will thus be appreciated that a magnetic thin-film medium having the axial compositional gradient medium provides an improvement over the non-gradient media formed from either one of the constituent alloys.

Although the invention has been described with respect to particular embodiments, it will be apparent to those skilled in the art that various changes and modifications can be made without departing from the invention.

It is claimed:

1. A method of forming a magnetic thin-film medium, comprising moving a non-metallic substrate, in an upstream-to-downstream direction, through a first sputtering zone having a single segmented target composed of adjoining upstream and downstream target segments, said upstream target segment being composed of a metal selected from the group consisting of Ti, W, Si, Mo, V, Nb, Ag, B, Al, Gd, and Ni/P, and being positioned to deposit sputtered material onto the substrate, as the substrate moves into and through an upstream region of said sputter deposition zone, and said downstream target segment being composed of Cr add being positioned to deposit sputtered Cr onto the substrate, as the substrate moves through and out of a downstream region of said sputter deposition zone, thereby forming on the substrate, an axial composition gradient underlayer in which the percentage of the upstream-target-segment metal in the underlayer decreases on progressing axially away from the substrate in a manner dependent on the relative dimensions of the two target segments in the direction of substrate movement through the sputtering zone, moving the substrate through a second sputtering zone having a Co-based magnetic alloy target, to deposit on the underlayer, a magnetic thin film having a thickness between about 150–1,000 Å, and moving the substrate through a third sputtering zone having a carbon target, to deposit a carbon overlayer on the magnetic thin film.

2. The method of claim 1, wherein said substrate is carried through said first and second sputtering zones on a pallet which supports a plurality of substrates.

3. The method of claim 1, wherein the underlayer is deposited onto the substrate to a final thickness of between about 1200–3200 Å.

4. The method of claim 1, wherein the underlayer is deposited onto the substrate to a final thickness of between about 1,000–4,000 Å.

5. The method of claim 1, wherein said substrate is moved through the second sputtering zone in an upstream-to-downstream direction, and the target in the second sputtering zone is a segmented target providing (i) an upstream target segment composed of a first alloy having relatively low noise and low magnetic remanence characteristics, when deposited by sputtering as a single magnetic layer, and positioned to deposit sputtered material onto the coated substrate, as the substrate moves into and through an upstream region of said second sputtering zone, and (ii) a downstream target segment composed of a second alloy having a relatively high magnetic remanence characteristic, and being positioned to deposit sputtered material onto the substrate, as the substrate moves through and out of a downstream region of said sputtering zone.

6. The method of claim 1, wherein the upstream target metal is Ti.

* * * * *